(12) United States Patent
Richter et al.

(10) Patent No.: US 12,239,061 B2
(45) Date of Patent: Mar. 4, 2025

(54) SYSTEM AND A METHOD TO MONITOR MOVING PARTS IN MACHINES

(71) Applicants: Wolfgang Richter, Vancouver (CA); Faranak Zadeh, Vancouver (CA)

(72) Inventors: Wolfgang Richter, Vancouver (CA); Faranak Zadeh, Vancouver (CA)

(73) Assignee: EPIC SEMICONDUCTORS INC

( * ) Notice: Subject to any disclaimer, the term of this patent is extended or adjusted under 35 U.S.C. 154(b) by 414 days.

(21) Appl. No.: 17/716,748

(22) Filed: Apr. 8, 2022

(65) Prior Publication Data

US 2022/0326118 A1 Oct. 13, 2022

Related U.S. Application Data

(60) Provisional application No. 63/172,816, filed on Apr. 9, 2021.

(51) Int. Cl.
| | | |
|---|---|---|
| *A01G 7/04* | (2006.01) | |
| *F02B 77/08* | (2006.01) | |
| *G01M 15/04* | (2006.01) | |
| *G01M 15/06* | (2006.01) | |
| *G01R 27/04* | (2006.01) | |
| *G01R 29/08* | (2006.01) | |

(Continued)

(52) U.S. Cl.
CPC .............. *A01G 7/04* (2013.01); *G01M 15/042* (2013.01); *G01M 15/06* (2013.01); *G01R 27/04* (2013.01); *G01R 29/0871* (2013.01); *H02J 50/05* (2016.02); *H04B 5/79* (2024.01); *F02B 77/083* (2013.01)

(58) Field of Classification Search
CPC .............. G05B 23/0208; F04B 1/0408; F04B 2201/0201
See application file for complete search history.

(56) References Cited

U.S. PATENT DOCUMENTS

| | | | | |
|---|---|---|---|---|
| 5,314,825 A | * | 5/1994 | Weyrauch ............ | G01N 35/025 422/63 |
| 6,752,026 B1 | * | 6/2004 | Hyde ..................... | G01F 1/586 73/861.15 |

(Continued)

*Primary Examiner* — Jermele M Hollington
*Assistant Examiner* — Temilade S Rhodes-Vivour

(57) ABSTRACT

Disclosed is a system for monitoring parts in a machine is provided. The system includes a base unit, and an electronic circuitry. The base unit includes a generator for generating controllable frequency, an impedance unit to resonate impedance with a matching frequency, a controller for modulating the impedance with commands, a first electrode to emit an alternating electric field, a mixer, and a communication unit for communicating the data and commands over a communication network. Further, the controller decodes changes in the impedance. The electronic circuitry includes a coupling electrode, a harvester for converting the alternating electric field into a DC energy, an analyzer to analyze the change in impedance of the provided alternating electric field caused by the parts of the machine, further the analyzer outputs the analyzing results as data, a modulator for modulating the alternating electric field with the data, wherein the modulated data is forked out by the mixer and processed by the controller, a floating electrode coupling to ground potential.

11 Claims, 4 Drawing Sheets

(51) Int. Cl.
*H02J 50/05* (2016.01)
*H04B 5/79* (2024.01)

(56) References Cited

U.S. PATENT DOCUMENTS

| | | | | |
|---|---|---|---|---|
| 2011/0048374 A1* | 3/2011 | McAlister | ............... | F02D 41/30 |
| | | | | 123/436 |
| 2015/0270719 A1* | 9/2015 | Kurs | ....................... | H02J 50/80 |
| | | | | 320/108 |
| 2017/0033591 A1* | 2/2017 | Govindaraj | ............. | H02J 50/10 |
| 2017/0098149 A1* | 4/2017 | Kesler | .................... | H02J 50/12 |

* cited by examiner

SYSTEM AND A METHOD TO MONITOR MOVING PARTS IN MACHINES

CROSS REFERENCE TO RELATED APPLICATIONS

The present application claims the benefit of U.S. Provisional Application No. 63/172,816, filed Apr. 9, 2021, which is incorporated by reference herein in its entirety.

BACKGROUND OF THE INVENTION

1. Field of the Invention

The present invention generally relates to a smart piston, and more specifically relates to a system and a method for monitoring moving parts in machines.

2. Description of Related Art

'Smart-Dust' is a system of many tiny microelectromechanical systems (MEMS) such as sensors, robots, or other devices that can detect, for example, light, temperature, vibration, magnetism, or chemicals. "Smart-Dust" may be ubiquitously placed everywhere to solve tasks like physical/chemical sensing and monitoring as well as computing and communicating in networks.

Every physical (and chemical) effect is based on the forces of electrons against each other in molecules or in contact zones of different elements from the periodic table. Such forces are attraction or repulsion (depending on electrical polarity) as well as positive, negative, or alternating electrical charges or ionization.

While it is possible to design and create electronic circuits on microscopic scale (e.g. silicon chips, ICs), it is very difficult and challenging to (preferably remotely, wirelessly or contactless) power and control such devices. The presence of radio waves restricts electro-magnetic equipment to work in an item or environment (e.g. metallic housings, cabinets, engine casing, racks, etc.) where the "smart-dust" particles are attached.

Arrangements of various sensors are used in analyzing piston machines, particularly reciprocating piston compressors, to absolutely prevent metal-to-metal contact of piston and cylinder wall, which can lead to premature operational failure and expensive damages.

This may even be more complicated if such items move against each other as parts of a machine like bearings, pistons, camshafts, gears, belts, rotors, or liquids, pastes, or gasses streaming in tubes, hoses or containers. Sensing the internal components e.g. of a running (combustion) engine is a demanding challenge.

This is even more obvious if sensors have to be attached on fast-moving parts like pistons, gears, bearings or camshafts, belts, rotors, etc. It is apparent that such sensing elements can't be wired to a controller, rather they have to be contactless wirelessly powered and operated.

Therefore, there is a need for a method, an apparatus, and a system to contactless measure (and wirelessly communicate) physical and/or chemical effects or mechanical events on moving parts of machines, vehicles, appliances, conveyors, robots, fluids and other items or engines. The moving parts can be a mechanical element as well as liquids or gasses in tubes, hoses, or containers.

Movement of such parts can be rotation, sliding, pushing, pulling, pressing, causing e.g. wear, friction, heat, abrasion or any kind of physical contact. Further the method and the system should be able to attach with such moving parts to operate preferably contactless and wirelessly, utilizing effects of electron entanglement as a kind of capacitive coupling.

SUMMARY OF THE INVENTION

In accordance with teachings of the present invention, a system for monitoring parts in a machine is provided.

An object of the present invention is to provide a system with a base unit, and an electronic circuitry. The base unit powers and generates commands. The base unit includes a generator for generating controllable frequency, an impedance unit to resonate impedance with a matching frequency, a controller for modulating the impedance with commands, a first electrode to emit an alternating electric field from the resonating frequency receive from the impedance unit, a mixer for combining data with the frequency, and a communication unit for communicating the data and commands over a communication network. Further, the controller decodes changes in the impedance.

The electronic circuitry is attached to the parts of the machine and is capacitively coupled with the base unit. The electronic circuitry includes a coupling electrode influenced by the modulated alternating electric field emitted from the controller via the first electrode, a harvester for converting the alternating electric field into a DC energy, an analyzer to analyze the change in impedance of the provided alternating electric field caused by the parts of the machine, further the analyzer outputs the analyzing results as data, a modulator for modulating the alternating electric field with the data, wherein the modulated data is forked out by the mixer and processed by the controller, a floating electrode coupling to ground potential.

Another object of the present invention is to provide the electronic circuitry further includes a needle electrode for enhancing the change in alternating electric field caused due to imperfections in the machine. Further, the part of the machine is moving and is a piston in a combustion engine.

Another object of the present invention is to provide the analyzer includes an array of electronic switches, an analog unit configurable with the electronic switches, and an integrated digital unit for switching and configuring signals for the analog unit under the control of the controller.

Another object of the present invention is to provide the analog unit further includes one or more sample & hold amplifiers to allow recurring signal processing by creating a feedback loop, and an operational amplifier to operate as required as per the instructions from the integrated digital unit.

Another object of the present invention is to provide the feedback loop allows the operational amplifier to work with either a delay or a lower gain or lower noise and different configurations. Further, the controller receives commands for predictive maintenance and digital twin visualization via the communication unit.

Another object of the present invention is to provide the controller which generates a unique identification number to identify the electronic circuitry attached to the parts of the machine. Further, the needle electrode is influenced by the alternating electric field emitted from the first electrode.

Another object of the present invention is to provide the integrated digital unit further includes a digital sequencer for operating the electronic switches, and a data transceiver block receives and stores commands from the controller in the digital sequencer.

While a number of features are described herein with respect to embodiments of the inventions; features described with respect to a given embodiment also may be employed in connection with other embodiments. The following description and the annexed drawings set forth certain illustrative embodiments of the inventions. These embodiments are indicative, however, of but a few of the various ways in which the principles of the inventions may be employed. Other objects, advantages, and novel features according to aspects of the inventions will become apparent from the following detailed description when considered in conjunction with the drawings.

BRIEF DESCRIPTION OF DRAWINGS

The annexed drawings, which are not necessarily to scale, show various aspects of the inventions in which similar reference numerals are used to indicate the same or similar parts in the various views.

DETAILED DESCRIPTION OF DRAWINGS

Figure 1:
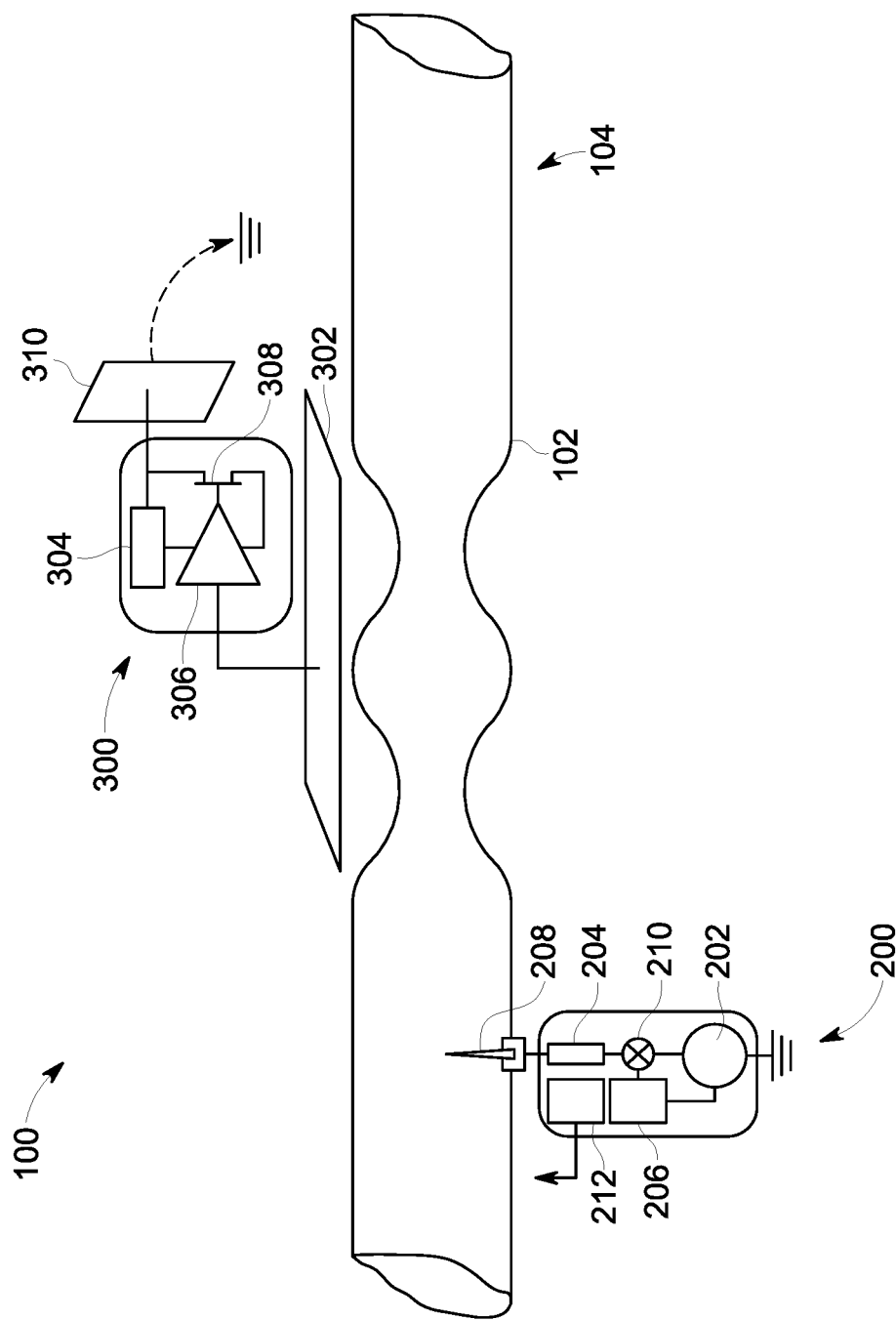
FIG. 1 illustrates a schematic diagram of a system for monitoring moving parts in a machine.

The present disclosure is now described in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

FIG. 1 illustrates a schematic diagram of a system 100 for monitoring moving parts 102 in a machine 104. The system 100 includes a base unit 200 and an electronic circuitry 300 attached to the parts 102 of the machine 104. Further, the electronic circuitry 300 is capacitively coupled with the base unit 200 over the air or a dielectric substance (e.g. oil).

The base unit 200 powers and generates commands for the electronic circuitry 300. The base unit 200 includes a generator 202, an impedance unit 204, a controller 206, a first electrode 208, a mixer 210 and a communication unit 212. The generator 202 generates a controllable frequency. The impedance unit 204 resonates impedance with a matching frequency.

The controller 206 modulates the impedance with commands. Further, the controller 206 decodes changes in the impedance. The first electrode 208 emits an alternating electric field from the resonating frequency received from the impedance unit 204. The mixer 210 combines data with the frequency.

The communication unit 212 communicates the data and commands over a communication network. Examples of the communication unit 212 include but not limited to a RF transceiver, serial connection, LAN, WAN, CAN, LIN, Bluetooth, NFC, Wi-Fi, 5G, Starlink, and other similar communication devices, etc. In another embodiment of the present invention, the controller receives commands for predictive maintenance and digital twin visualization via the communication unit 212.

Examples of the generator 202 include but not limited to an oscillator, PWM, toggled I/O pin, etc. Examples of the impedance unit 204 include but not limited to a resonator, SAW, Quartz or crystals, coils, inductors, in series or combination with capacitors. Examples of the controller 206 include but not limited to a microcontroller (MCU), CPLD, FPGA etc. with connected peripherals (I/O Ports, UARTS, WiFi, Displays, ADC, DAC etc.). Examples of the mixer 210 include but not limited to a MOSFET, Transistor, opto-coupler, MEMS switch, Gilbert cell, etc.

The electronic circuitry 300 includes a coupling electrode 302, a harvester 304, an analyzer 306, a modulator 308, and a floating electrode 310. The coupling electrode 302 is influenced by the modulated alternating electric field emitted from the controller 206 via the first electrode 208.

The harvester 304 converts the alternating electric field into DC energy. The analyzer 306 analyzes the change in impedance of the provided alternating electric field caused by the parts 102 of the machine 104. Further, the analyzer 306 outputs the analyzing results as data.

The modulator 308 modulates the alternating electric field with the data. The modulated data is forked out by the mixer 210 and is processed by the controller 206. The floating electrode 310 couples to the ground potential. Examples of the harvester 304 include but not limited to a rectifier, Graetz bridge, AC-DC convertor, MOS switches etc.

Examples of the analyzer 306 include but not limited to instrumentation amplifiers (INA), operational amplifiers (OPA), auto-gain stages, analog comparators, comb filters etc. Examples of the modulator 308 include but not limited to a MOSFET, Transistor, opto-coupler, MEMS switch, etc.

In one preferred embodiment, the base unit has a microcontroller (e.g. ARM MCU) 206. One of its output pins provides a pulse-width modulated rectangle signal ~100-500 kHz and is connected to an emitter electrode 208 inside the combustion engine via a (L/C) resonator fork. This results in a weak alternating electric field (AeF) emitted from the electrode.

The electronic circuitry 300 also termed as "smart-dust", is equipped with a moving part 102 in reach (e.g. <1 m) and couples capacitively with the alternating electric field (AeF), which propagates over the parts surface. The electronic "smart-dust" circuit 300 has an integrated harvester 304 that converts the alternating electric field (AeF) into DC energy (e.g. ~1 mW) and a precise synchronized operation (system) clock for its subcircuits.

The controller 206 of the base unit 200 sends a sensor configuration sequence (data and commands) by e.g. modulating the duty-cycle of the alternating electric field (AeF) frequency, which is securely received by the "smart-dust's electronic circuitry" 300 integrated digital unit (2010, shown in FIG. 2) and is further linked to a digital sequencer (not shown in Figures). Thus, the integrated digital unit (2010, shown in FIG. 2) connects the required sub-circuits sequential via electronic switches (2006, shown in FIG. 2, e.g. transmission gates) to build any required sensor. The sensor configuration stays stable until a new sequence is received.

The sensing results are repeatedly encrypted as a payload and, together with a unique identifier (ID), sent back from the integrated digital unit (2010, shown in FIG. 2) to the controller 206 of the base unit 200 by modulating the alternating electric field (AeF) via a subcarrier, divided from the (system) clock. In this case, the conductive material of the moving part 102 acts as an electrode with a load against ground.

Figure 2:
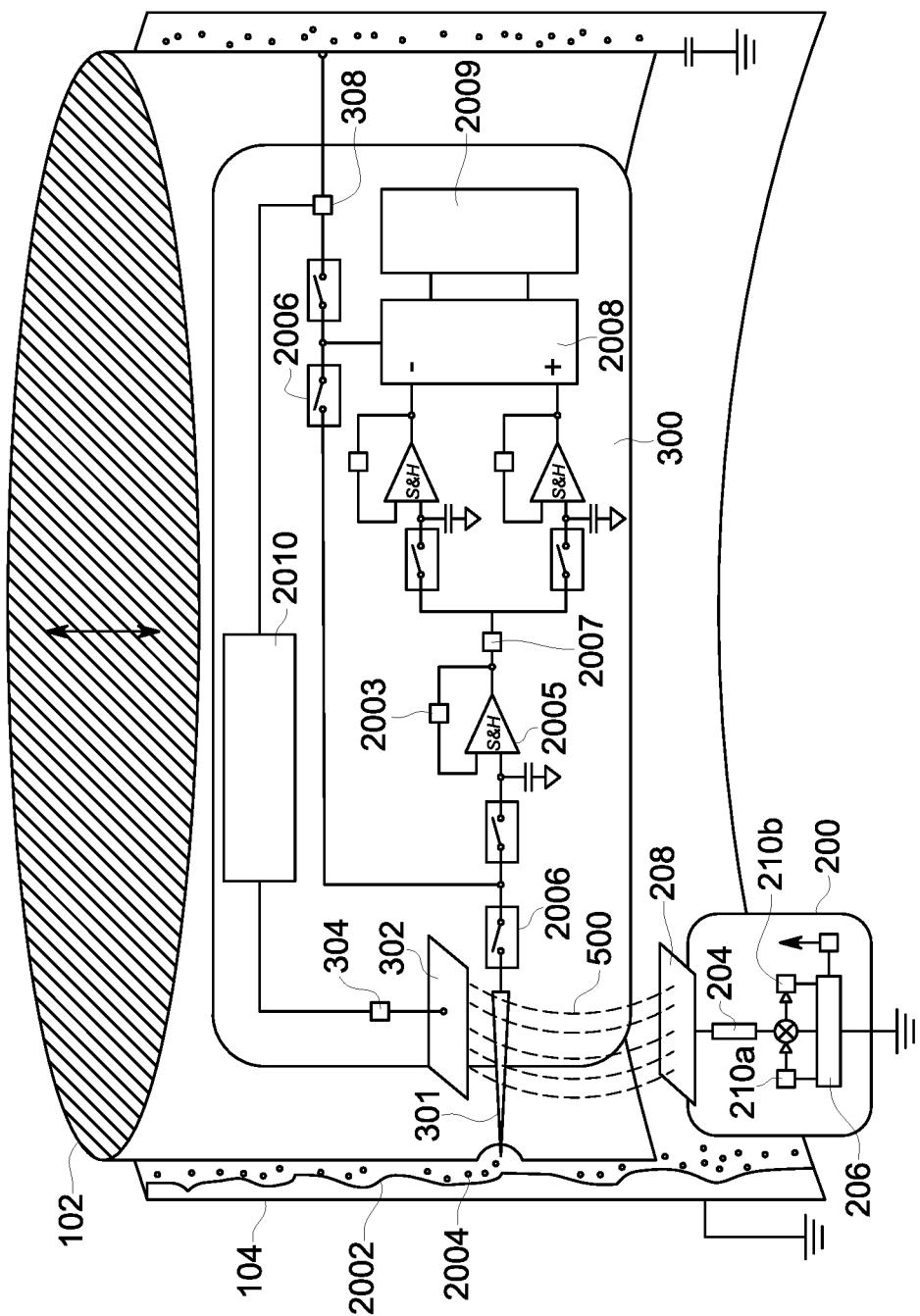
FIG. 2 illustrates a cross-section view of a moving part moving up and down inside the machine.

FIG. 2 illustrates a cross-section view of a moving part 102 moving up and down inside the machine 104. In an exemplary embodiment, the moving part 102 is a piston and the machine 104 is a cylinder 104 of a combustion engine. The inner wall of the cylinder 104 may show signs of wear 2002 e.g. caused by metallic particles in the tiny oil film 2004 separating piston 102 and the cylinder 104 as dielectric gliding lubricant.

The invention related electronic "smart-dust" circuitry 300 is attached to the piston 102 e.g. in a dent or in a tiny hole. The circuitry 300 further includes a conductive needle 301 which is influenced by an external provided alternating electric field 500 generated from the base unit 200.

The harvester 304 consisting of rectifiers (e.g. diodes, Greatz, etc.) and Schmitt Triggers, converts the alternating electrical charges from the alternating electric field 500 from the coupling electrode 302 into a useable DC power to operate the electronic sub-circuits of the "smart dust" particle 300.

Further, the harvester 304 provides a clock signal derived from the field's frequency. The alternating electric field 500 may be modulated with digital instructions from the remote base unit 200. In one embodiment, the analyzer (306, shown in FIG. 1) includes an array of electronic switches 2006, an analog unit 2008 configurable with the electronic switches 2006, an integrated digital unit 2010 for switching and configuring signals for the analog unit 2008 under the control of the base unit's controller 206.

The instructions/commands may further be stored in the integrated digital unit 2010 to create a sequence to switch in the electronic circuitry 300 integrated electronic switches (e.g. transmission gates) 2006 between the analog unit 2008 and the sub circuits integrated into the electronic circuitry 300.

The analog unit 2008 further includes sample & hold amplifiers 2005 to allow recurring signal processing by creating a feedback loop 2003. The feedback loop 2003 allows the analog unit 2008 (e.g. analog operation amplifier) to work with either a delay or a lower gain or a lower noise or on different configurations.

The "sample & hold" (S&H) block unit 2005 consists of plurality of analogue operational amplifiers with adjustable feedback 2003 (e.g. for gain, rectifying, attenuating, logarithm, integrating, etc.), filter stages 2007. The analog unit 2008 is configured from the integrated digital unit 2010 to act e.g. as programmable gain amplifiers, inverters, buffers, comparators, multipliers, summing amplifiers, differentiators or integrators, etc. depending on the received related instructions.

The electronic "smart dust" circuit 300 further includes a switchable passive components block unit 2009 containing resistors and capacitors to support the configuration of the analog unit 2008 under the control of the integrated digital unit 203. The modulator sub circuit 308 allows modulating the external provided alternating electric field 500 with data (information, measurement results) converted from the analog unit 2008.

The controller (e.g. MCU, FPGA, etc.) 206 generates a frequency (e.g. 500 kHz). In one embodiment, the mixer is preferably in two parts wherein the mixer 210a allows modulating the frequency with instructions from the controller 206 while another part of the mixer 210b extracts the information modulated into the e-field by the "smart dust" particle's modulator 308 and provides them to the controller 206 for further processing.

The generated frequency appears on the electrode 208 over the impedance unit 204 as an alternated electric field that influences the piston 102 and its attached "smart-dust" circuitry 300.

In one embodiment, a part of the field energy concentrates on the tip of the needle electrode 301 which creates a capacitive coupling to the inner cylinder wall where the capacity varies if imperfections 2002 in the cylinder wall 104 or particles in the oil film 2004 occur. The changes on the inside wall of the cylinder are analyzed by the circuit's analog sub-circuits. The results are modulated into the alternating electric field (that now acts as a carrier) and received by the base station 300 to be further processed.

In an exemplary embodiment, the needle electrode 301 resembles a kind of "scanning tunneling microscope" (STM)—because the small electrical changes appearing on the needle's tip are amplified, filtered, and analyzed by the sub-circuits of the "smart-dust" particle 300. In a kind of a round robin loop, outputs of the analog unit 2008 are returned to the S&H circuit 2005 and then redirected into the same analog unit 2008 that may be reconfigured in the meantime from the integrated digital unit 2010.

In another embodiment, "sample & hold" circuits 2005 direct signals to positive or negative (e.g. OP-amp) inputs of the analog unit 2008 under the control of the instructions in the digital unit 2010. The base station's impedance unit 204 (e.g. a resonator coil, transformer, etc.) removes overwaves by creating a sine wave and allows level shifting to control the strength of the alternating electric field 500 emitted by the electrode 208.

In an embodiment of the present invention, the integrated digital block 2010 includes a data transceiver block and a digital sequencer. The data transceiver block receives and stores commands from the controller 206 in the digital sequencer to sequential activate the electronic switches accordingly to the received commands.

Examples of the integrated digital block 2010 include but not limited to an arrangement of digital gates, flip flops, counters, pointers, ALU, memory, I/O, etc. Examples of the analog unit 2008 include but not limited to operational amplifiers, bandgap references, comparators, components for analog computing, arrangements of the analog sub-circuits resemble a configurable analog computer, etc.

Figure 3:
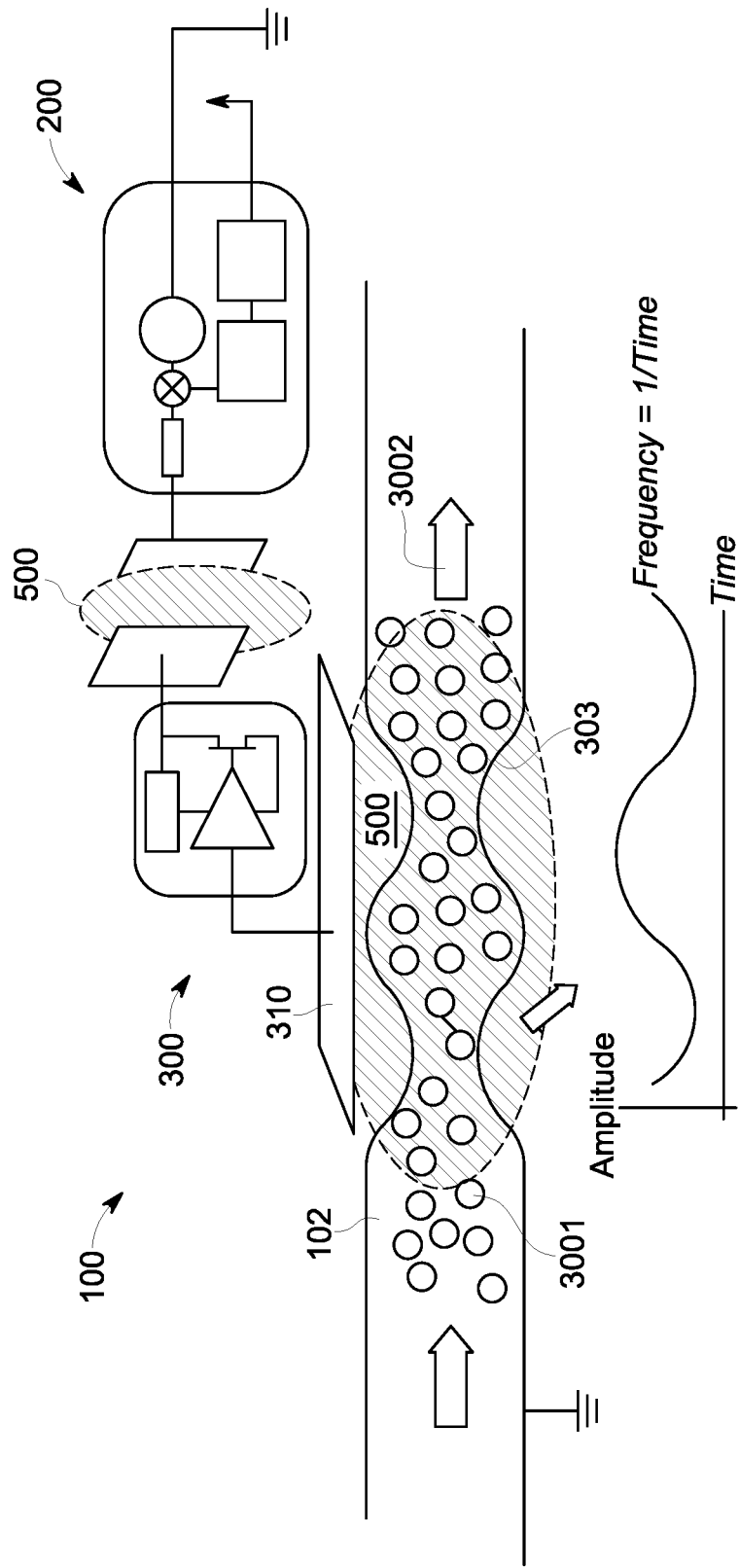
FIG. 3 illustrates a schematic diagram of the system showing a working principle of a 'Bernoulli flute'.

FIG. 3 illustrates a schematic diagram of the system 100 showing a working principle of a 'Bernoulli flute'. The floating electrode 310 directs the alternating electric field to a part 102 (tube, a hose, or container) of the machine (104, shown in FIGS. 1 & 2). The part 102 has a zone with a ripple structure 303 where a streaming material 3001 (which can be a gas, oil, a liquid, plasma, or paste) gets frequently compressed or expanded depending on the speed and viscosity of the streaming material 3001.

This creates a difference in the electrical charges in form of a frequency that gets analyzed by the "smart dust's" electrical circuitry 300 that further modulates the provided alternating electric field with data about the consistency, homogeneity, physical and chemical status of the streaming medium. The modulation creates a related voltage change which is then processed by the base unit 200.

The ground connection 501 that is e.g. on the tube 102 and on the gateway closes the circuit. In another embodiment, the system 100 identifies the flow of direction of the medium streams 3002. There are other forms of structures inside the tube possible like various curves or others that create an electric charge difference of the streaming medium (or material).

The change in electric charge is caused with ionization of charged particles that move through the ripple zone in different quantities in combination with physical effects known as the Bernoulli effect. The physical and chemical effects are measured due to electron movement on molecular level affecting the impedance of the system.

Figure 4:
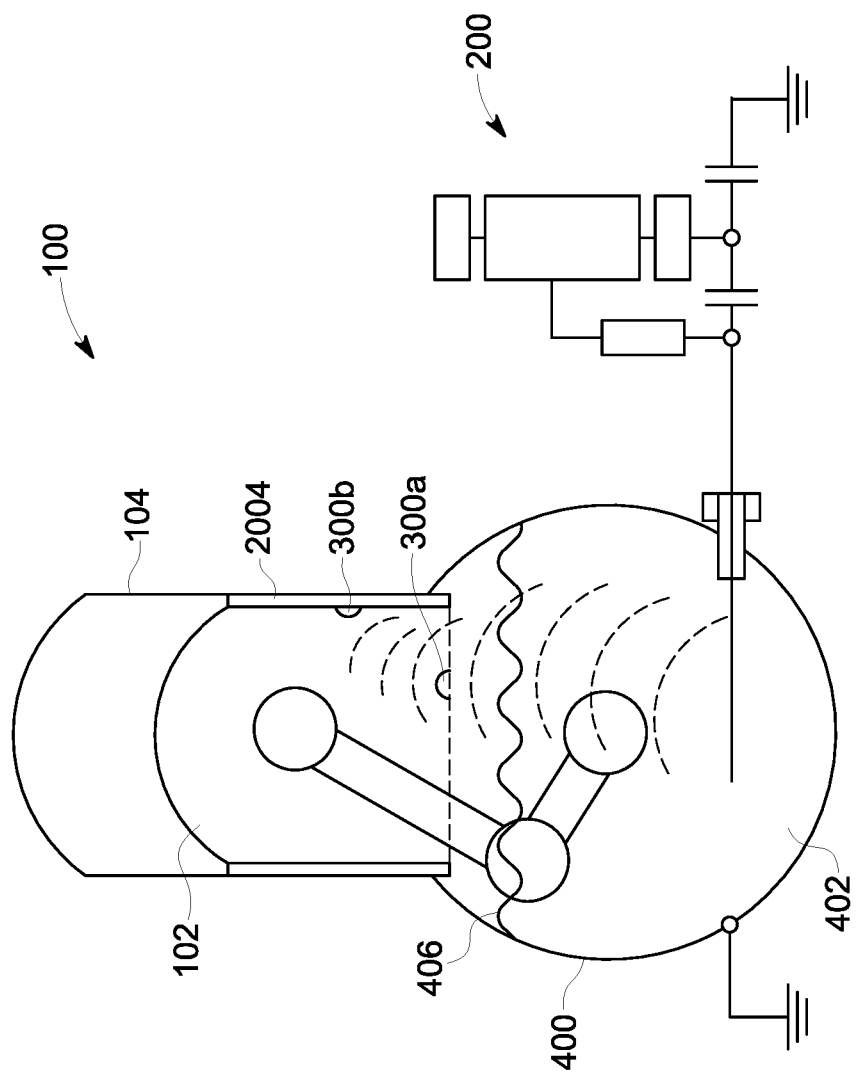
FIG. 4 illustrates a schematic view of the system attached to a moving piston operating in a cylinder of the machine in accordance with another embodiment of the present invention.

FIG. 4 illustrates a schematic view of a system 100 attached to a moving piston 102 operating in a cylinder 104 of a machine 400 in accordance with another embodiment of the present invention. The piston glides on an oil film 2004 that is provided by a reservoir of oil 402 in the bottom of the machine 400. In an embodiment, the machine 400 is a combustion engine.

The base station 200 emits an alternating electric field inside the machine 400. The machine 400 (e.g. engine) and the base station 200 have a common ground, which may either earth ground or another conductive surface e.g. the metallic body of a car, a ship, or a machine.

It would be readily apparent to those skilled in the art that multiple electronic circuitries (smart dust particles/circuitries) 300 such as 300a, 300b may be envisioned without deviating from the scope of the present invention. The electronic circuitry 300a, 300b are influenced by the alternating electric field using the piston 102 as an electrode.

Therefore, the piston 102 creates a capacitor with the cylinder 104 and the oil film 2004 as a dielectric. The electronic circuits 300a and 300b may have mains to measure field strength and (changes in) the capacitance. During the operation of the engine 400, the oil reservoir 402 may create ripples 406 due to vibrations/oscillations on its surface, that may be detected as frequent changes in the capacitance, or modulated heat waves from at least one of the electric circuits 300a or 300b.

The flow of the oil is detected by identifying which electronic circuitry has identified the change in the alternating electric field. Further, the electronic circuits 300a and 300b are able to assess the quality of the oil in the reservoir 104, as well as its temperature, which can, for example, be measured by detecting infrared radiation emitted from the oil 402.

Further, the electronic circuits 300a and 300b measure the distance or changes in the distance between the piston 102 and the cylinder wall 104, or the compression/oil control rings. In another embodiment of the invention, variations of the electronic "smart-dust" circuits 300a, 300b are attached on or near bearings, gears, chains, valves, gaskets or other parts of an engine.

It would be readily apparent to those skilled in the art that various type of machines such as combustion engines, e.g. 2-stroke, 4-stroke, Diesel, Sterling, Wankel or electric motors, gear boxes, transmissions, conveyor systems, power trains in cars and other vehicles or machines, may be envisioned without deviating from the scope of the present invention.

The present invention offers various advantages such as electronic circuitry using a proprietary technology based on electron entanglement with the objective not to attach sensors on items but turn those items into sensors themselves to monitor their physical and chemical reactions to forces like acceleration, speed, friction and abrasion or changes in volume, temperature, speed or pressure, etc.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others. The scope of the invention is indicated by the appended claims rather than by the foregoing description. All changes which come within the meaning and range of equivalency of the claims are to be embraced within their scope.

The invention claimed is:

1. A system for monitoring moving parts in a machine, the system comprising:
   a base unit for powering and generating commands, the base unit comprising:
      a generator for generating controllable frequency;
      an impedance unit to resonate impedance with a matching frequency;
      a controller for modulating the impedance with commands, further the controller decodes changes in the impedance;
      a first electrode to emit an alternating electric field from the resonating frequency received from the impedance unit;
      a mixer for combining data with the frequency; and
      a communication unit for communicating the data and commands over a communication network;
   an electronic circuitry attached to the parts of the machine and capacitively coupled with the base unit, wherein the electronic circuitry comprising:
      a coupling electrode influenced by the modulated alternating electric field emitted from the controller via the first electrode;
      a harvester for converting the alternating electric field into a DC energy;
      an analyzer to analyze the change in impedance of the provided alternating electric field caused by the parts of the machine, further the analyzer outputs the analyzing results as data, wherein the analyzer comprising:
         an array of electronic switches;
         an analog unit configurable with the electronic switches; and
         an integrated digital unit for switching and configuring signals for the analog unit under the control of the controller;
      a modulator for modulating the alternating electric field with the data, wherein the modulated data is forked out by the mixer and processed by the controller; and
      a floating electrode coupling to ground potential.

2. The system according to claim 1, wherein the part of the machine is a piston in a combustion engine.

3. The system according to claim 1, wherein the part of the machine is moving.

4. The system according to claim 1, wherein the electronic circuitry further comprises a needle electrode for enhancing the change in alternating electric field caused due to imperfections in the machine.

5. The system according to claim 4, wherein the needle electrode is influenced by the alternating electric field emitted from the first electrode.

6. The system according to claim 1, wherein the analog unit further comprising one or more sample & hold amplifiers to allow recurring signal processing by creating a feedback loop.

7. The system according to claim 1, wherein the analog unit further comprising an operational amplifier to operate as required as per a set of instructions from the integrated digital unit.

8. The system according to claim 7, wherein the feedback loop allows the operational amplifier to work with at least one of: a delay; a lower gain; a lower noise; and different configurations.

9. The system according to claim 1, wherein the controller receives commands for predictive maintenance and digital twin visualization via the communication unit.

10. The system according to claim 1, wherein the controller generates a unique identification number to identify the electronic circuitry attached to the parts of the machine.

11. The system according to claim 1, wherein the integrated digital unit further comprising:
- a digital sequencer for operating the electronic switches; and
- a data transceiver block receives and stores commands from the controller in the digital sequencer.

* * * * *